United States Patent
Kozin et al.

(10) Patent No.: US 8,902,087 B1
(45) Date of Patent: Dec. 2, 2014

(54) DATA DECOMPRESSION UTILIZING PRE-EXPANDED DICTIONARIES DURING DECOMPRESSION

(71) Applicant: International Business Machines Corporation, Armonk, NY (US)

(72) Inventors: Daniel Kozin, Santa Clara, CA (US); Maggie M Lin, San Jose, CA (US); Arthur Marais, Montgomery, TX (US); Timothy E McAllister, Cedar Park, TX (US); Nigel G Slinger, Los Gatos, CA (US); John B. Tobler, San Jose, CA (US); Wen J Zhu, Beijing (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/011,227

(22) Filed: Aug. 27, 2013

(51) Int. Cl.
*H03M 7/34* (2006.01)
*H03M 7/30* (2006.01)
*H03M 7/40* (2006.01)

(52) U.S. Cl.
CPC ............. *H03M 7/3084* (2013.01); *H03M 7/30* (2013.01); *H03M 7/40* (2013.01); *H03M 7/76* (2013.01)
USPC ............................................. 341/51; 341/65

(58) Field of Classification Search
CPC ............ H03M 7/30; H03M 7/40; H03M 7/46
USPC ............................. 341/51, 87, 65, 67, 63, 106
See application file for complete search history.

(56) References Cited

U.S. PATENT DOCUMENTS

| | | | |
|---|---|---|---|
| 4,876,541 A * | 10/1989 | Storer | 341/51 |
| 5,339,076 A | 8/1994 | Jiang | |
| 5,469,161 A | 11/1995 | Bezek | |
| 5,608,396 A | 3/1997 | Cheng et al. | |
| 5,646,617 A | 7/1997 | Ohmoto et al. | |
| 5,673,042 A | 9/1997 | Yoshida et al. | |
| 5,936,560 A | 8/1999 | Higuchi | |
| 6,664,903 B2 | 12/2003 | Kugai | |
| 2010/0211583 A1 | 8/2010 | Basso | |

FOREIGN PATENT DOCUMENTS

| | | |
|---|---|---|
| JP | 2000516058 | 11/2000 |
| JP | 2002353818 | 12/2002 |

OTHER PUBLICATIONS

Christina Zeeh "The Lempel Ziv Algorithm", Jan. 16, 2003, 17 pages.
Ross N. Williams "An Extremely Fast ZIV-Lempel Data Compression Algorithm", 1991 IEEE, pp. 362-371.
PCT International Search Report and Written Opinion dated Sep. 16, 2014, 7 pages.

* cited by examiner

*Primary Examiner* — Joseph Lauture
(74) *Attorney, Agent, or Firm* — Mohammed Kashef; Edell, Shapiro & Finnan, LLC

(57) ABSTRACT

According to one embodiment, a computer-implemented method of decompressing compressed data is described. A first decompression dictionary is analyzed, the first decompression dictionary including a plurality of chains each with uncompressed data portions distributed in a non-contiguous manner within the first decompression dictionary based on an addressing scheme, where the uncompressed data portions of each chain form a corresponding uncompressed version of compressed data. A second decompression dictionary is generated by combining the uncompressed data portions of each of the chains in the first decompression dictionary to form uncompressed versions of compressed data and instructions are inserted within the second decompression dictionary to decompress compressed data. The compressed data are decompressed by applying the compressed data to the second decompression dictionary. Embodiments further include a system and computer program product for decompressing compressed data in substantially the same manner described above.

20 Claims, 3 Drawing Sheets

DATA DECOMPRESSION UTILIZING PRE-EXPANDED DICTIONARIES DURING DECOMPRESSION

BACKGROUND

1. Technical Field

Present invention embodiments relate to compression and decompression, and more specifically, to using pre-expansion of a decompression dictionary and self-decompressing data elements to improve decompression performance.

2. Discussion of the Related Art

Modern software applications make extensive use of compression to reduce the size of data stored on disk or in memory, or transmitted across a network. Compression techniques may be lossless or lossful. Lossful techniques may be used when it is acceptable to lose some data relative to the original source data. For example, a photo presented by way of a low resolution system (e.g., a cell phone display) may not need all of the detail provided by the higher resolution source photo (e.g., a high resolution family portrait). The cell phone essentially displays the substance of the higher resolution family portrait, but with the reduced processing and storage requirements available by using the lower resolution image.

Lossless techniques for compressing data may be used when a loss of data would be detrimental (e.g., a loss of a bank account digit, a loss of social security number, or loss of data for mission critical systems such as emergency response systems). The use of compression and decompression techniques generally trade off CPU processing resources with disk space or data transmission resources on both the compression and the decompression processing end. In other words, increased compression efficiency typically requires more processing resources and less storage space, while decreased compression efficiency typically requires less processing resources and more storage or transmission resources. Traditional approaches for increasing efficiency have focused on the compression algorithm.

BRIEF SUMMARY

According to one embodiment of the present invention, a computer-implemented method of decompressing compressed data is described. A first decompression dictionary is analyzed. The first decompression dictionary includes a plurality of chains each with uncompressed data portions distributed in a non-contiguous manner within the first decompression dictionary based on an addressing scheme, where the uncompressed data portions of each chain form a corresponding uncompressed version of compressed data. A second decompression dictionary is generated by combining the uncompressed data portions of each of the chains in the first decompression dictionary to form uncompressed versions of compressed data and instructions are inserted within the second decompression dictionary to decompress compressed data. The compressed data are decompressed by applying the compressed data to the second decompression dictionary. Embodiments of the present invention further include a system and computer program product for decompressing compressed data in substantially the same manner described above.

BRIEF DESCRIPTION OF THE SEVERAL VIEWS OF THE DRAWINGS

Generally, like reference numerals in the various figures are utilized to designate like components.

DETAILED DESCRIPTION

Figure 1:
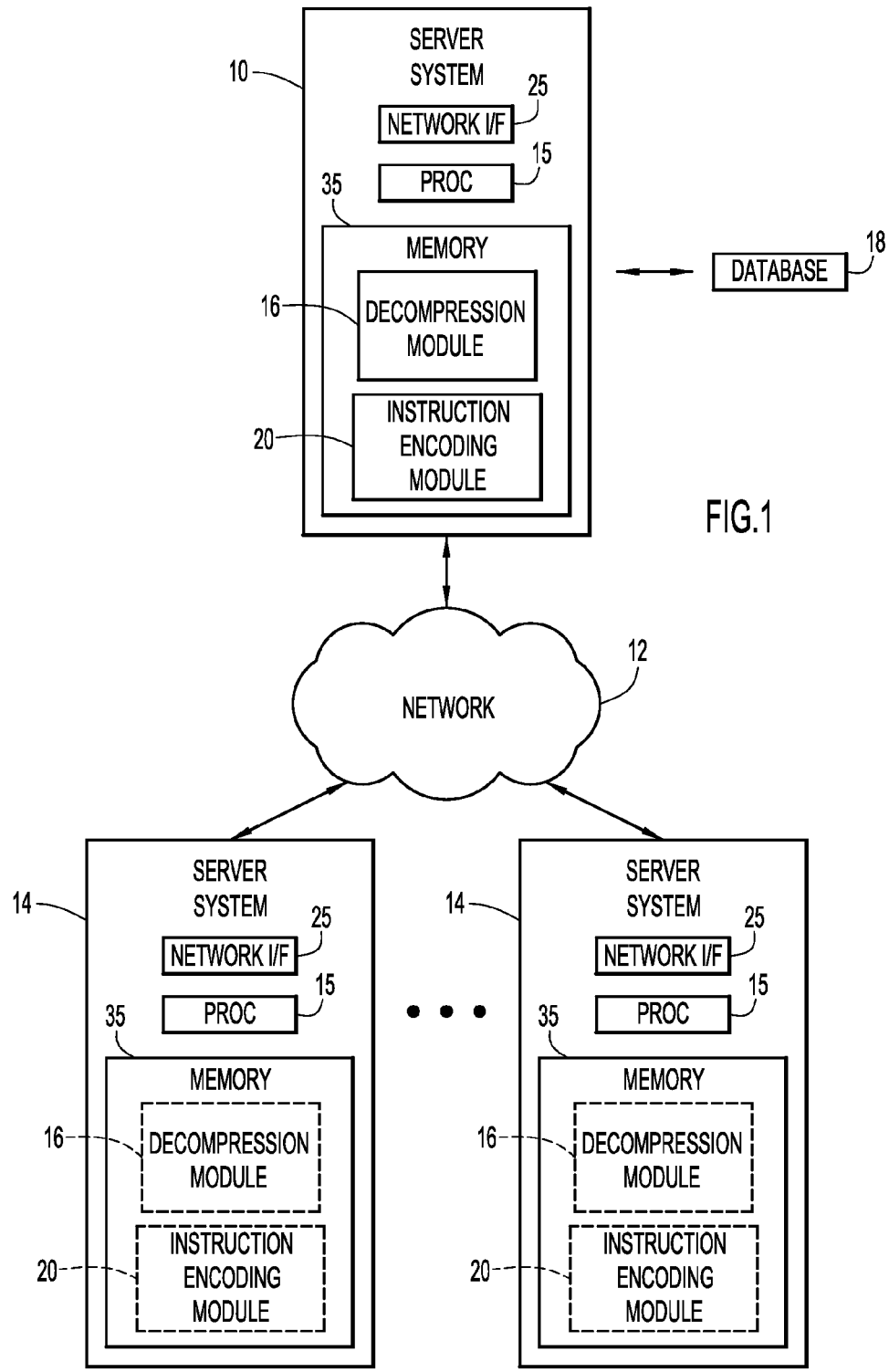
FIG. 1 is a diagrammatic illustration of an example computing environment for use with an embodiment of the present invention.

Although many data compression techniques exist along with their corresponding decompression counterparts, the techniques described herein become particularly useful in symbol or token substitution lossless compression techniques such as the Ziv-Lempel algorithm. The Ziv-Lempel algorithm achieves efficiency by substituting a series of symbols with a single symbol but with additional encoding. For example, the letter "A" could be replaced by a the number one, "B" by the number two, and so on through the 26 letters of the English alphabet, yet this is still a one-for-one symbol substitution.

However, in any given language, a series of symbols are common. For example, the word "the" comprises three symbols or a single token, and is widely used in the English language. In this case, the entire word "the" could be represented by a single symbol such as the numeral "1" one which needs only a single bit (or a single byte when stored as a character), thereby reducing the three symbol word to a single symbol for a three-to-one (3:1) substitution efficiency. In order to obtain increased efficiency, a bit-wise code may be used (e.g., a minimum number of bits to encode the token). In this example, the numeral "1" becomes a substitution code for the token "the". Furthermore, when grammar constructs are involved, one can discern that the word "the" is always surrounded by at least two spaces when not part of another word such as "anthem" for which the symbol "the" is contained wholly therein (e.g., an'the'm). Accordingly, the word "the" as found in English is usually of the form "the" surrounded by two spaces (i.e., the word "the") for a total of five symbols, but may still be replaced by the single code such as the numeral "1," thereby reducing the five symbols in the token to a single code for a 5:1 substitution efficiency. Further efficiencies can be achieved when phrases are repeated within the source document.

The original tokens and their corresponding substitution codes are stored in a dictionary. In this regard, a simplified view of a compression that uses simple substitution would be to "look up" the code "1" and substitute the token "the" (with spaces) during decompression. However, in actual operation the input data stream is usually processed serially (e.g., consider compressing a large volume encyclopedia) with new tokens being added as they are encountered. Accordingly, the compression dictionary is not just a simple lexicon, but a complex encoding of the input tokens from the uncompressed data and token addressing within the dictionary to ultimately recover the original data without loss. Such complexity will become apparent during an example presented hereinafter with respect to a decompression technique for a Ziv-Lempel compression.

For ease of description, the techniques described herein are described with reference to a base algorithm that is widely used such as the Ziv-Lempel compression scheme. Many of the techniques described herein may translate to other compression and decompression techniques (e.g., context tree weighting or byte-pair encoding). Depending on the academic circle, Ziv-Lempel is also referred to as Lempel-Ziv (LZ). As used herein, Ziv-Lempel, Lempel-Ziv, and LZ all refer to the Ziv-Lempel algorithm, or variants and equivalents thereof.

Since its inception, Ziv-Lempel has been advanced by improvements to the algorithm for a particular application (e.g., by the addition of Huffman coding techniques) to form a family of LZ algorithms. For example, the LZ77 and LZ78 algorithms have been used for disparate applications. LZ77 has efficiency when used with the .ZIP file compression and Stacker disc compression algorithms. In another variation, LZ78 has efficiency when used with transmitting data over a network using the V.42 modem standard or with image compression that uses Graphics Interchange Format (GIF) compression. Thus, Ziv-Lempel algorithms have evolved over time.

Traditional compression techniques are generally more directed to the efficiency of the compression rather than the efficiency of the decompression. Present invention embodiments enhance efficiency of the decompression. An example environment for use with present invention embodiments is illustrated in FIG. 1. Specifically, the environment includes one or more server systems 10, and one or more client or end-user systems 14. Server systems 10 and client systems 14 may be remote from each other and communicate over a network 12. The network may be implemented by any number of any suitable communications media (e.g., wide area network (WAN), local area network (LAN), Internet, intranet, etc.). Alternatively, server systems 10 and client systems 14 may be local to each other, and communicate via any appropriate local communication medium (e.g., local area network (LAN), hardwire, wireless link, intranet, etc.).

Server systems 10 and client systems 14 may be implemented by any conventional or other computer systems preferably equipped with a display or monitor (not shown), a base (e.g., including at least one processor 15, one or more memories 35 and/or internal or external network interfaces or communications devices 25 (e.g., modem, network cards, etc.)), optional input devices (e.g., a keyboard, mouse or other input device), and any commercially available and custom software (e.g., server/communications software, string decompression recording module, instruction encoding module, browser/interface software, etc.).

Client systems 14 enable users to compress a data set or retrieve a compressed data set (e.g., files, documents, pictures, etc.) to or from server systems 10. The server systems include a decompression module 16 to decompress data (e.g., files, documents, pictures, etc.) that has been previously compressed (e.g., according to the Ziv-Lempel algorithm), and an instruction encoding module 20 to embed instructions for self-decompression once the compressed data set is retrieved (e.g., by a data processing system or a user) as described below.

A database system 18 may store various forms of compression based information (e.g., compressed data and databases, and decompression dictionaries, etc.). The database system may be implemented by any conventional or other database or storage unit, may be local to or remote from server systems 10 and client systems 14, and may communicate via any appropriate communication medium (e.g., local area network (LAN), wide area network (WAN), Internet, hardwire, wireless link, intranet, etc.).

By way of brief summary of present invention embodiments, a traditionally compressed data set is pre-expanded according to the techniques described herein. In the examples described herein, compressed data is decompressed to a fixed length, their original length, or some other convenient length that aids decompression efficiency. With respect to Ziv-Lempel compression, decompression is achieved by an expansion of the dictionary which is essentially a "translation" dictionary defined during compression that converts the smaller reference codes to their original counterpart tokens (e.g., the code numeral "1" is converted to "the" as described above). The expanded counterpart tokens are concatenated in a specified order to form the original source data, thereby producing the original data that was compressed.

Alternatively, one or more client systems 14 may perform decompression when operating as a stand-alone unit. In a stand-alone mode of operation, the client system stores or has access to the data (e.g., compressed data and databases, and decompression dictionaries, etc.), and includes decompression module 16 and instruction encoding module 20 to insert instructions for storage and decompression. In essence, an LZ dictionary is partially expanded to obtain a second dictionary. The use of the second decompression dictionary during decompression ultimately leads to recovery of the original data set.

The graphical user (e.g., GUI, etc.) or other interface (e.g., command line prompts, menu screens, etc.) of client system 14 solicits information from a corresponding user pertaining to the desired data and analysis, and may provide reports including analysis results (e.g. compression efficiencies, pre-expansion efficiencies, CPU usage during final decompression, etc.).

Modules 16 and 20 may include one or more modules or units to perform the various functions of present invention embodiments described below. The various modules (e.g., decompression module 16, instruction encoding module 20, etc.) may be implemented by any combination of any quantity of software and/or hardware modules or units, and may reside within memory 35 of the server and/or client systems for execution by processor 15. In this regard, decompression module 16 performs decompression and instruction encoding module 20 inserts instructions into the second dictionary that are used for self-decompression to produce resulting decompressed data as described below.

Figure 2A:
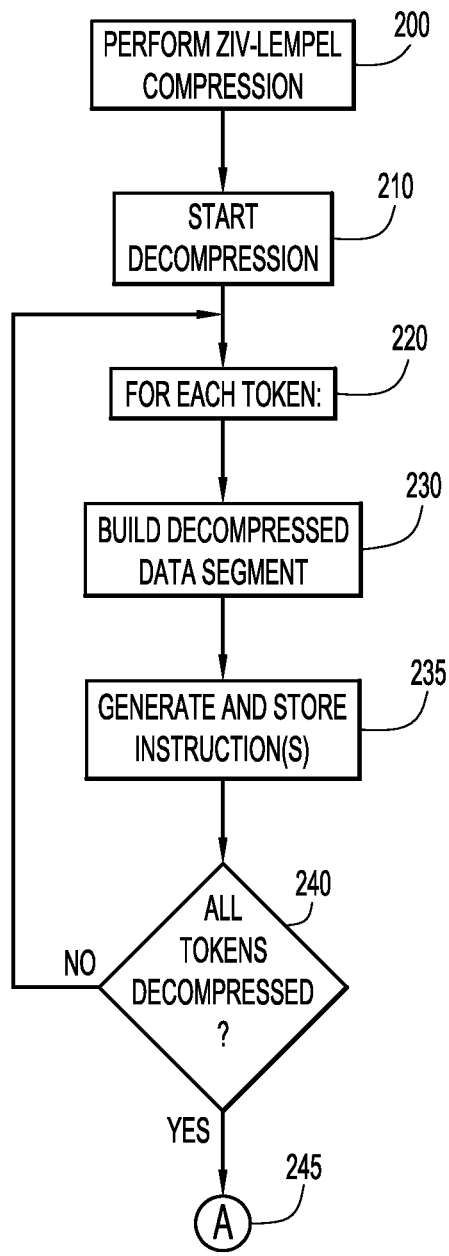
FIG. 2A is a procedural flow chart illustrating a manner in which a second decompression dictionary is generated from an initial decompression dictionary of a compression scheme according to an embodiment of the present invention.
Figure 2B:
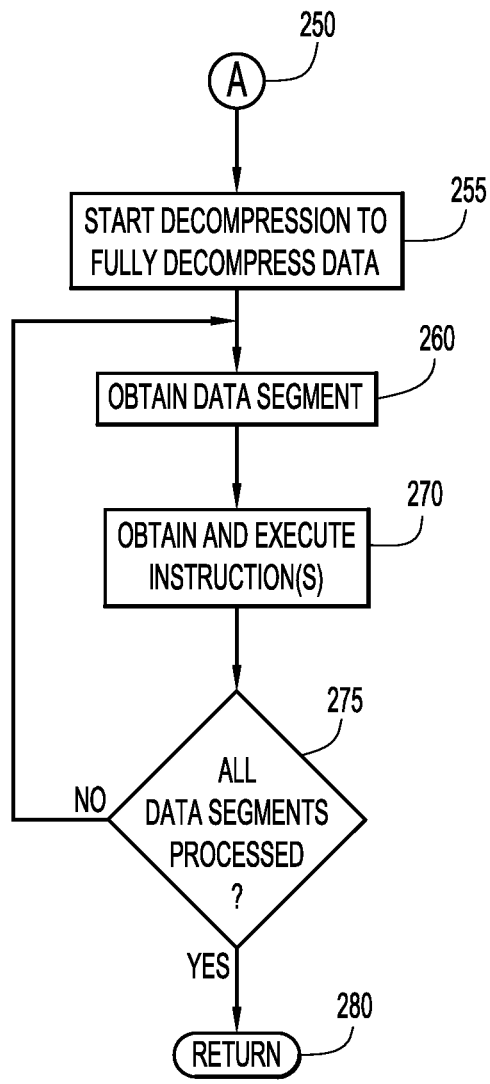
FIG. 2B is a procedural flow chart illustrating a manner of decompressing compressed data utilizing the second decompression dictionary according to an embodiment of the present invention.

A manner in which decompression module 16 and instruction encoding module 20 (e.g., via a server system 10 and/or client system 14) performs pre-expansion and decompression according to embodiments of the present invention is illustrated in FIGS. 2A and 2B. FIG. 2A illustrates example processes for pre-expansion, while FIG. 2B illustrates a decompression process.

Specifically, referring to FIG. 2A, Ziv-Lempel compression is preformed at step 200 to produce a compressed data set and the associated decompression dictionary. The resulting compressed data set may include an array of codes (substituted for the original data), and an associated decompression dictionary that maps to the array of codes, or provides a combination tokens and dictionary array. The decompression dictionary contains expanded and decompressed versions of compressed tokens of data segments from the original data, where the decompressed versions of the tokens are chained together by an addressing scheme to form a decompressed data segment as described below. Compression 200 may be performed using traditional Ziv-Lempel techniques and/or modified techniques to provide further efficiencies according to the techniques described herein. Decompression of the compressed data set is started at step 210 (e.g., as performed by decompression module 16) and produces a second modified decompression dictionary. The original decompression dictionary and the second modified decompression dictionary may both be stored for decompression according to the capabilities of the end device, or system rules or requirements.

For each token of a data segment compressed during compression of the data set, the token is processed to produce decompressed data at step 220. An example Ziv-Lempel decompression is presented in detail below. In the example below, compressed entries are coded with 12 bits (e.g., as 3 four-bit hexadecimal nibbles) and are used to derive a corresponding eight byte (64 bit) expansion for a compressed token, where the expanded data segment (having a plurality of tokens) includes 29 bytes or characters, sometimes referred to as a string (e.g., a 29 character expansion string). The memory location used in this example for decompression starts at memory address 0149_64393014x, where the "x" indicates hexadecimal (base sixteen) notation in which each digit is four bits (e.g., 0-Fx) and the memory locations are expressed in terms of a quantity of bytes (8 bits). By way of example, the decompression dictionary is loaded into memory at address 00000048_B6C88000x. An example portion of the compressed data is provided below with the starting address on the left and the contents of four subsequent memory locations (e.g., each containing 32 bits or 4 bytes) to the right of each address.

| 0149_64393000 | 10C9DAC1 | 4B730500 | 00043F00 | 01BB0F0C |
| 0149_64393010 | 0D676E1A | 04002001 | CB0141EC | 7CD37D4C |
| 0149_64393020 | DDAE33AF | 6057AE0D | 3B833CD9 | C73CBACD |
| 0149_64393030 | 4DEDB1A0 | 04002101 | CB0241EC | 7CD37D4C |

The first six bytes starting at address 0149_64393014x is a header, in this case the value is 04002001CB01x and is dash underlined above. The next 12 bits after the header, 41Ex, is the 12 bit code for the first token (fully underlined) and is essentially a pointer into the decompression dictionary. Using an eight byte expansion, the memory offset into the decompression dictionary is multiplied by eight (i.e., 41Ex×8, or 20F0x). Adding this value to the decompression dictionary start location of 48_B6C88000x (leading zeros omitted) yields 20F0x+48B60C8000x=48B60CA0F0x. Example decompression dictionary data at that location is provided below with the starting address on the left and four memory stores to the right of each address:

| 48_60CA0F0 | A4190030 | 00300018 | A41A3000 | 30003019 |

An eight byte token expansion is present at this address and underlined (the data in the last two memory locations are not germane to this example). The token expansion begins with the hexadecimal number "A" followed by a 12 bit expansion address 419x, followed by five bytes (40 bits) of uncompressed data 0030003000x. Accordingly, the token in this example not only contains uncompressed data, but also contains metadata (i.e., a four bit instruction "A" and an expansion address). Thus far, the uncompressed data in the expanded data segment is the value of the token or 0030003000x. By convention, since the first four bits of the token expansion are not zero, but the value A, the data segment expansion is deemed to be incomplete, and the 12 bit expansion of 419x address is used to continue the expansion of the data segment. The next memory offset into the decompression dictionary is 419xx8, or 20C8x. Adding this value to the decompression dictionary start location of 48_B6C88000x yields 20C8x+48B60C8000x= 48B60CA0C8x. The decompression dictionardata at that memory location may be, for example:

| 48_60CA0C8 | A4143400 | 31003013 | A414A3000 | 30003019 |

An eight byte token expansion for the next token in the data segment is present at this address. The token expansion begins with the hexadecimal number "A" followed by a 12 bit expansion address 414x, followed by five bytes of uncompressed data 3400310030x for the token. This data is concatenated with the uncompressed data in the expanded data segment. Thus far, the uncompressed data in the expanded data segment is 340031003000300030003000x. Since the first four bits of this token expansion are not zero, the expansion continues, and the 12 bit expansion of 414x address is used to generate a new address of 48B60CA0A0x in the manner described above. The decompression dictionary data at that memory location may be, for example:

| 48_60CA0A0 | A40F0050 | 006000E | A414A3000 | 30003019 |

An eight byte token expansion for the next token is present at this address. The token expansion begins with the hexadecimal number "A" followed by a 12 bit expansion address 414x, followed by five bytes of uncompressed data 0500006000x. This data is concatenated with the uncompressed data in the expanded data segment. Thus far, the uncompressed data in the expanded data segment is 050000600034003100300030003000x. The process continues for successive tokens until the first four bits of a succeeding eight byte token expansion is zero. By way of example, the fourth through sixth iterations of the expansion yields the following tokens:

| 48_60C9E58 | A3C6002C | 003C0004 | A414A3000 | 30003019 |
| 48_60CA078 | A3CB3E00 | 40004209 | A414A3000 | 30003019 |
| 48_60C9E30 | 04001200 | 18000000 | A414A3000 | 30003019 |

In this example, by the sixth iteration the first four bits of the eight byte token expansion are zero (underlined), thereby indicating that expansion for this data segment is complete. The next digit is not an address, but the value of four (underlined) that indicates that 4 bytes of data remain. In this example, the four bytes are 00120018x (underlined). A final concatenated or expanded value for the data segment is represented using the example below:
41Ex=001200183E00400042002C003C000050006000 34003100300030003000X The expansion for the data segment is stored in the second modified decompression dictionary, and may be retrieved based on the memory location within the initial token expansion. With respect to the above example, the original memory location from the first iteration, 41Ex, may be used as the data entry point for the expanded data segment in the second modified decompression dictionary. In other words, the second modified decompression dictionary basically operates as look-up table to retrieve the expanded data segments. The process continues until all data segments (and tokens) in the decompression dictionary have been expanded and stored in the second modified decompression dictionary at step 230.

The above data segment has a known length of 29 bytes. In order to achieve compression efficiency, each data segment or token may be used more than once when decompression takes place. The expanded data segments in the second decompression dictionary may be concatenated in the same manner as that described above in order to decompress the data segments.

In order to provide the decompressed data segment, one or more instructions are generated and stored in the second modified decompression dictionary at step 235 (e.g., as performed by instruction encoding module 20). In one example, a move (or copy) instruction is generated and stored at step 235. The move instruction moves data from one memory location to another. For example, the decompressed data segments in the decompression dictionary are concatenated by moving the decompressed data segments together into a common storage area.

An example move instruction is described below in terms of assembly or assembler language (e.g., 360 assembly or x86 assembly). Assembly language may be tied to the underlying processor architecture and uses pseudo-English like codes to represent processor instructions. For speed of execution, many computer compilers and processing subroutines are written in assembly language. Accordingly, the logic described by way of the code examples below may be adapted to the processing platform. In one example, the assembly language instruction move character (MVC) is placed or stored (e.g., in memory or on disc) in a location that is adjacent a location of each decompressed data segment within the second modified decompression dictionary at step 235. Other instruction codes may be used to copy or move data depending on the computing environment (e.g., MVI, MHHVI, MOV, etc.). Example MVC instructions are shown below:

MVC TARGET, SOURCE \\MOVE SOURCE TO TARGET

MVC TARGET(40), SOURCE \\MOVE 40 BYTES FROM SOURCE TO TARGET

The first example MVC instruction moves data (e.g., characters) from the source storage location to the target storage location. The source and target memory locations may be defined in a computer program. The second example MVC instruction moves 40 data elements (e.g., characters) from the source storage location to the target storage location. The MVC instruction provides for movement of up to 256 data elements (e.g., characters), thereby allowing the concatenation of data segments to ultimately produce a decompressed data set. In this example, the TARGET may be the common storage location described above and the SOURCE is a decompressed data segment in the second modified decompression dictionary (e.g., as generated by decompression module 16).

In this example, the memory location or relative memory location of each MVC instruction placed adjacent the decompressed data segment within the second modified decompression dictionary is also stored in a separate instruction jump table at step 235. The 29 bytes or characters of the above example data segment may be moved by a corresponding MVC instruction (MVC TARGET (29), SOURCE). The instruction jump table allows for fast iterative decompression of compressed data.

To further clarify, a first token is iteratively processed to produce a first expanded data segment. The first expanded data segment (e.g., the 29 byte string) and an MVC instruction (or representation thereof) is stored in the second modified decompression dictionary. The first token and a memory offset of zero (i.e., zero for a first entry) are stored in the jump table. The memory offset is advanced to a current offset in order to accommodate the length of the string and the MVC instruction as stored in the second modified decompression dictionary. The next (or a second) token is iteratively processed to produce a second expanded string. The second token and the current memory offset are stored as a next entry in the jump table. The memory offset is advanced to accommodate the length of the second string and the MVC instruction, and the process continues until token processing is complete.

Accordingly, the jump table has a list of tokens and corresponding pointers or memory address offsets into the second modified decompression dictionary, where the pointer inherently account for expansion string length (i.e., by way of offset advancement). Thus, the source addresses for an MVC instruction are available by way of the jump table, while the target addresses are provided by the controlling software to provide the designated target addresses for the MVC instructions. Processing the entries in the jump table enable efficient concatenation of a series of expanded strings. An example assembly language sample to decompress the second modified decompression dictionary is depicted below and described in connection with FIG. 2B. The code sample includes a jump table that was generated as described above.

Whether all data segments or a given number of data segments has been expanded is determined at step 240. If all data segments have not been expanded, the process is repeated at step 220. Otherwise, the process continues at 245 and proceeds to FIG. 2B. At this point, the pre-expansion of the data segments in the compressed data set is complete. Decompression of the data set can take place at a later time when the original source data is retrieved.

The manner in which the second modified decompression dictionary is utilized for decompression is described in connection with FIG. 2B. The decompression process may continue from FIG. 2A at 250, or be performed (e.g., by decompression module 16) when original source data is requested. The decompression starts at step 255. An initial token of a data segment is obtained from the compressed data at step 260. The token may include a pointer into the second modified decompression dictionary (e.g., 41Ex described above). The instruction of the corresponding expansion is executed at step 270. Continuing the jump table example described above in connection with FIG. 2A, the corresponding or first MVC instruction is located in the jump table and executed. An assembly code segment is listed below that has a jump table and an example modified decompression dictionary.

The code below processes all 12 bit encoded entries for data in a pre-expanded database table row or record. This code sample uses 31-bit addressing, however, a 48 bit, 64-bit or any other suitable existing or future coding scheme may be employed that uses logic similar to the 31-bit addressed code as provided herein. The upper portion of the code sample comprises example code that concatenates pre-expanded data segments. The lower portion starts with dictionary entries or "DICTENTS" that include a jump table and pre-expanded dictionary entries. The DICTENTS code and data may be the result of expansion dictionaries that have been previously pre-processed and stored in the second modified decompression dictionary (e.g., as a result of operations performed as described in connection with FIG. 2A). The DICTENTS labeled code (e.g., ENT labels) and dictionary entries with assembly language code (e.g., MOV labels) are loaded into memory prior to executing or instantiating the upper code segment. The expansion code and dictionary entries may reside in different regions of memory, and are listed below:

```
*          R0       CONTAINS THE COUNT OF 12-BIT DICTIONARY ENTRIES TO PROCESS
*          R1       POINTS TO THE NEXT COMPRESSED ROW BYTE (SOURCE)
*          R3       POINTS TO THE TARGET (EXPANDED) DATA
*          R9       POINTS TO THE GENERATED DICTIONARY INFORMATION ("DICTENTS")
           XR       R6,R6               CLEAR FOR INS CHAR W/MASK(ICM)
ENTLOOP0   DS       0H                  LOOP THROUGH ENTRIES
           ICM      R6,B'0111',0(R1)    1 OR 2 12-BIT ENTRIES
           LA       R1,3,(R1)           BUMP UP TO NEXT (IF ANY)
           SRDL     R6,12               R6 IS 1ST 12-BIT ENTRY
           SRL      R7,18               R7 IS NEXT ENTRY (IF ANY) * 4
           SLL      R6,2                R6 TIMES 4 (ADDR COMET SIZE)
           L        R15,0(R6,R9)        CODE FRAGMENT FOR 12-BIT ENTRY
           BALR     R14,R15             EXECUTE IT
           BRCT     R0,ENTLOOP1         IF ANOTHER 12-BIT ENTRY
           J        CHKLEN              ELSE WE'RE DONE THIS ROW
ENTLOOP1   DS       0H
           L        R15,0(R7, R9)       CODE FRAGMENT FOR 12-DIT ENTRY
           BAIR     R14,R15             EXECUTE IT
           BRCT     R0,ENTLOOP0         IF ANOTHER 12 -BIT ENTRY
CHKLEN     DS       0H
Dictionary Entries DICTENTS   DS       0D
ENT000     DC       A(MOV000)           START OF JUMP TABLE
ENT001     DC       A(MOV001)
...
ENTFFE     DC       A(MOVFFE)
ENTFFF     DC       A(MOVFFF)           END OF JUMP TABLE
MOV000     MVI      0(R3),X'00'         START OF PRE-EXPANDED CODE AND
           LA       R3,1(,R3)           DATA SEGMENTS
           BR       R14
MOV001     MVI      0(R3), X01'
           LA       R3,1(,R3)
           BR       R14
...
MOVFFE     MVC      0(102,R3),12(R15)
           LA       R3,102(,R3)
           BR       R14
           DC       X'F9C1C2C3C4C5C6C7C8C9D1D2D3D4D5D6'
           DC       X'D7D8D9E2E3E4E5E6E7E8E9F0F1F2F3F4'
           DC       X'F5F6F7F8F9C1C2C3C4C5C6C7C8C9D1D2'
           DC       X'D3D4D5D6D7D8D9E2E3E4E5E6E7E8E9F0'
           DC       X'F1F2F3F4F5F6F7F8F9C1C2C3C4C5C6C7'
           DC       X'C8C9D1D2D3D4D5D6D7D8D9E2E3E4E5E6'
           DC       X'E7E8E9F0F1F2'
MOVFFF     MVC      0(103,R3),12(R15)
           LA       R3,103(,R3)
           BR       R14
           DC       X'F9C1C2C3C4C5C6C7C8C9D1D2D3D4D5D6'
           DC       X'D7D8D9E2E3E4E5E6E7E8E9F0F1F2F3F4'
           DC       X'F5F6F7F8F9C1C2C3C4C5C6C7C8C9D1D2'
           DC       X'D3D4D5D6D7D8D9E2E3E4E5E6E7E8E9F0'
           DC       X'F1F2F3F4F5F6F7F8F9C1C2C3C4C5C6C7'
           DC       X'C8C9D1D2D3D4D5D6D7D8D9E2E3E4E5E6'
           DC       X'E7E8E9F0F1F2F3'
END OF CODE & DATA SEGMENTS
```

The above DICTENTS code and data include a jump table with an entry "ENT" labels enumerated from 000x to FFFx (i.e., ENT000-ENTFFF). The ENT enumeration values from 000x to FFFx represent all possible values (permutations) provided by a 12 bit expansion. Labels are used in the assembly language code as a pseudo-English construct that allows the programmer (and the assembly language compiler) to define one or more lines of code associated with the label. Each ENT label has a corresponding move "MOV" label. When an ENT entry in the jump table is processed the corresponding MOV code is executed. For example, label ENTFFE points to label MOVFFE. MOVFFE, in turn, has instructions (e.g., that include an MVC instruction) to move 102 bytes of pre-expanded (uncompressed) data from a first 12 bit expansion to the target address pointed to by register R3 (the target address may be provided by the calling software). Following the MVC instruction is a load address "LA" instruction that increments or advances the target address in the R3 register by 102. The next entry, ENTFFF, points to MOVFFF which has instructions to move 103 bytes of data from a second 12 bit expansion to the target address pointed to by R3 that was previously incremented by 102. The length of each pre-expanded data segment may vary among differing modified expansion dictionaries.

After execution of the assembly language instructions associated with a MOV label, the program returns to the jump table for the next instruction. In lieu of MVC instructions, pointers into the second modified decompression dictionary are stored in the jump table. The second modified decompression dictionary contains the MVC instruction, and after execution of the MVC instruction, the program returns to the jump table for the next pointer. Whether all data segments have been processed is determined at step 275. In one example, the last entry in the jump table contains a return instruction that returns to the main calling (decompression) program. If not, the process returns to step 260. Otherwise the process ends at step 280.

Several example variations for generating and storing the instructions (e.g., by instruction encoding module 20 at step 235), and obtaining and executing those instructions (e.g., by decompression module 16 at step 270) are now described. In a first example, instead of storing MVC instructions in a jump table, the MVC instruction and a length of any given decompressed string is stored (e.g., by instruction encoding module 20 at step 235) next to each decompressed data segment in the second modified decompression dictionary. Each decompressed string is then padded (e.g., by instruction encoding module 20 at step 235) with spare bytes to obtain a decompressed data segment of fixed length. The padding bytes are not part of the expansion string, but used to obtain a designated fixed length, and need not be filled with any particular information. Accordingly, each entry in the second modified decompression dictionary may include an MVC instruction, an expanded data segment, and padding (e.g., to achieve a fixed length of 256 bytes).

This first example variation has the advantage that fixed length addressing may be used, thereby simplifying jump logic. For example, during decompression, the 12 bit value used to decompress can be used to index directly into the decompression dictionary by multiplying the 12-bit value by the size of the padded entries. Once this location in the decompression dictionary is branched to, the data segment length is obtained and the decompressed data segment is moved for concatenation (e.g., by decompression module 16 at step 270).

In a second example variation, the MVC instruction is stored in an instruction array in lieu of a jump table. Once each decompressed data segment is built, an MVC instruction is inserted into the instruction array (e.g., by instruction encoding module 20 at step 235). When this technique is employed, only MVC instructions are stored in the instruction array and the main (calling) application branches into the MVC array. The MVCs in the instruction array and the data segments may be stored in separate storage sections or partitions within the second decompression dictionary. Since the instruction array and the data segments are stored separately (i.e., the instruction array is not inter-mixed with the data segments), when loaded into memory, the MVC instruction array can be loaded into a cache memory (e.g., an instruction cache) and the data segments can be loaded into a separate memory (e.g., RAM, a data cache, etc.) Accordingly, the instruction array technique can take advantage of cache structures (e.g., instruction caches, data caches, etc.). During decompression, the MVC instructions in the instruction array are iteratively executed to move the data segments for concatenation (e.g., by decompression module 16 at step 270).

In a third example variation, continuation logic is stored along with the MVC instruction in the instruction array (e.g., by instruction encoding module 20 at step 235). During decompression, the MVC instruction in the array is executed for concatenation and the continue instruction is checked (e.g., by decompression module 16 at step 270). If the continue logic determines that additional MVC instructions remain, the continuation logic executes the next MVC instruction, if not, decompression is complete. By way of the above example, decompression can take place with a single call, and the decompression self-executes, thereby enabling self-decompressing data segments. In other words, the algorithm concatenates all of the data segments prior to returning to the main calling application.

In sum, a series of move instructions are executed iteratively in a present invention embodiment until all pre-expanded data segments have been concatenated, thereby providing the original data set that was used for compression (e.g., Ziv-Lempel compression). In the above example, several iterations have been performed just to obtain an initial 29 byte data segment. However, these iterations do not have to be executed by present invention embodiments during decompression (e.g., as performed by decompression module 16) described in connection with FIG. 2B. Comparative evaluations of traditional LZ decompression versus a present invention embodiment showed reductions in elapsed time and CPU processing overhead of 43% and 81%, respectively.

It will be appreciated that the embodiments described above and illustrated in the drawings represent only a few of the many ways of implementing embodiments for data decompression utilizing pre-expanded and self-decompressing string to increase processing efficiency during decompression.

The environment of the present invention embodiments may include any number of computer or other processing systems (e.g., client or end-user systems 14, server systems 10, etc.) and databases or other repositories arranged in any desired fashion, where the present invention embodiments may be applied to any desired type of computing environment (e.g., cloud computing, client-server, network computing, mainframe, stand-alone systems, etc.). The computer or other processing systems employed by the present invention embodiments may be implemented by any number of any personal or other type of computer or processing system (e.g., desktop, laptop, PDA, mobile devices, etc.), and may include any commercially available operating system and any combination of commercially available and custom software (e.g., browser software, communications software, server software, string decompression module 16, instruction encoding module 20, etc.). These systems may include any types of monitors and input devices (e.g., keyboard, mouse, voice recognition, etc.) to enter and/or view information.

It is to be understood that the software (e.g., string decompression module 16, instruction encoding module 20, etc.) of the present invention embodiments may be implemented in any desired computer language and could be developed by one of ordinary skill in the computer arts based on the functional descriptions contained in the specification and flow charts illustrated in the drawings. Further, any references herein of software performing various functions generally refer to computer systems or processors performing those functions under software control. The computer systems of the present invention embodiments may alternatively be implemented by any type of hardware and/or other processing circuitry.

The various functions of the computer or other processing systems may be distributed in any manner among any number of software and/or hardware modules or units, processing or computer systems and/or circuitry, where the computer or processing systems may be disposed locally or remotely of each other and communicate via any suitable communications medium (e.g., LAN, WAN, intranet, Internet, hardwire, modem connection, wireless, etc.). For example, the functions of the present invention embodiments may be distributed in any manner among the various end-user/client and server systems, and/or any other intermediary processing devices. The software and/or algorithms described above and illustrated in the flow charts may be modified in any manner that accomplishes the functions described herein. In addition, the functions in the flow charts or description may be performed in any order that accomplishes a desired operation.

The software of the present invention embodiments (e.g., string decompression module 16, instruction encoding module 20, etc.) may be available on a non-transitory computer readable or useable medium (e.g., magnetic or optical mediums, magneto-optic mediums, floppy diskettes, CD-ROM, DVD, memory devices, etc.) of a stationary or portable program product apparatus or device for use with stand-alone systems or systems connected by a network or other communications medium.

The communication network may be implemented by any number of any type of communications network (e.g., LAN, WAN, Internet, intranet, VPN, etc.). The computer or other processing systems of the present invention embodiments may include any conventional or other communications devices to communicate over the network via any conventional or other protocols. The computer or other processing systems may utilize any type of connection (e.g., wired, wireless, etc.) for access to the network. Local communication media may be implemented by any suitable communication media (e.g., local area network (LAN), hardwire, wireless link, intranet, etc.).

The system may employ any number of any conventional or other databases, data stores or storage structures (e.g., files, databases, data structures, data or other repositories, etc.) to store information (e.g., expansion dictionaries, compressed data, etc.). The database system may be implemented by any number of any conventional or other databases, data stores or storage structures (e.g., files, databases, data structures, data or other repositories, etc.) to store information (e.g., expansion dictionaries, compressed data, etc.). The database system may be included within or coupled to the server and/or client systems. The database systems and/or storage structures may be remote from or local to the computer or other processing systems, and may store any desired data (e.g., expansion dictionaries, compressed data, etc.).

The present invention embodiments may employ any number of any type of user interface (e.g., Graphical User Interface (GUI), command-line, prompt, etc.) for obtaining or providing information (e.g., pre-expansion instructions, data retrieval, reports etc.), where the interface may include any information arranged in any fashion. The interface may include any number of any types of input or actuation mechanisms (e.g., buttons, icons, fields, boxes, links, etc.) disposed at any locations to enter/display information and initiate desired actions via any suitable input devices (e.g., mouse, keyboard, etc.). The interface screens may include any suitable actuators (e.g., links, tabs, etc.) to navigate between the screens in any fashion.

The reports may include any information arranged in any fashion, and may be configurable based on rules or other criteria to provide desired information to a user (e.g. compression efficiencies, pre-expansion efficiencies, CPU usage during full decompression, etc.).

The present invention embodiments are not limited to the specific tasks or algorithms described above, but may be utilized for pre-expansion of compressed data. The data may be compressed according to any lossless compression technique including, but not limited to Ziv-Lempel based techniques.

Any number and type of decompression (or expansion) dictionaries may be employed and stored. The expansion dictionaries may include any type of pre-expansion that fully or partially decompressed the underlying data to increase processing efficiency during decompression.

The instructions stored in the pre-expansion dictionaries may be of any form that allows concatenation of data during expansion (e.g., move, copy, MVC instructions, etc.). The concatenation instructions may be used along with pre-expansion string lengths to obtain the correct string length. The pre-expanded strings may contain padding to obtain any desired length. The concatenation instructions, string lengths, etc., may be stored within the decompression dictionary, or as separate jump or instruction tables. The concatenation instructions may include continuation logic or other instructions that allow continuous execution of the instructions or allows any desired code branching or jumping, and may allow for data expansion with a single function call or with multiple calls to obtain desired processing characteristics (e.g., dictionary expansion times, CPU utilization, etc.).

The compressed data entries may be of any desired length (e.g., eight bit, 12 bit, etc.) and may include any form of addressing to expand the compressed and pre-expanded data. The expansion tokens may be of any desired length (e.g., eight byte, 16 byte, etc.) and may include any desired metadata (e.g., continue instruction, termination instructions, expansion addresses, etc.) The expanded data sets may include any desired instructions (e.g., move, copy, continuation instructions, etc.) that assist the decompression process. Any form of cache structure may be used or exploited to facilitate pre-expansion, expansion, instruction storage (e.g., jump tables, instruction caches, temporary storage, instruction operands, etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes", "including", "has", "have", "having", "with" and the like, when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer-implemented method of decompressing compressed data comprising:

analyzing a first decompression dictionary including a plurality of chains each with uncompressed data portions distributed in a non-contiguous manner within the first decompression dictionary based on an addressing scheme, wherein the uncompressed data portions of each chain form a corresponding uncompressed version of compressed data;

generating a second decompression dictionary by combining the uncompressed data portions of each of the chains in the first decompression dictionary to form uncompressed versions of compressed data and inserting instructions within the second decompression dictionary to decompress compressed data; and decompressing compressed data by applying the compressed data to the second decompression dictionary.

2. The computer-implemented method of claim 1, wherein the compressed data is compressed according to a Ziv Lempel compression scheme.

3. The computer-implemented method of claim 1, wherein the instructions within the second decompression dictionary include instructions to decompress a single token of the compressed data in a single move.

4. The computer-implemented method of claim 1, wherein the instructions within the second decompression dictionary include instructions to decompress all tokens in the compressed data in a single call.

5. The computer-implemented method of claim 1, wherein the instructions within the second decompression dictionary are independent of computer architecture.

6. The computer-implemented method of claim 1, wherein the instructions and uncompressed versions are together within the second decompression dictionary to exploit cache structures.

7. The computer-implemented method of claim 1, wherein the instructions within the second decompression dictionary include one or more of a move instruction to concatenate the uncompressed versions of compressed data, a length associated with the uncompressed versions of compressed data, and a continuation instruction.

8. A system comprising:
a computer system including at least one processor configured to:
analyze a first decompression dictionary including a plurality of chains each with uncompressed data portions distributed in a non-contiguous manner within the first decompression dictionary based on an addressing scheme, wherein the uncompressed data portions of each chain form a corresponding uncompressed version of compressed data;
generate a second decompression dictionary by combining the uncompressed data portions of each of the chains in the first decompression dictionary to form uncompressed versions of compressed data and inserting instructions within the second decompression dictionary to decompress compressed data; and
decompress compressed data by applying the compressed data to the second decompression dictionary.

9. The system of claim 8, wherein the compressed data is compressed according to a Ziv Lempel compression scheme.

10. The system of claim 8, wherein the instructions within the second decompression dictionary include instructions to decompress a single token of the compressed data in a single move.

11. The system of claim 8, wherein the instructions within the second decompression dictionary include instructions to decompress all tokens in the compressed data in a single call.

12. The system of claim 8, wherein the instructions within the second decompression dictionary are independent of computer architecture.

13. The system of claim 8, wherein the instructions and uncompressed versions are together within the second decompression dictionary to exploit cache structures.

14. The system of claim 8, wherein the instructions within the second decompression dictionary include one or more of a move instruction to concatenate the uncompressed versions of compressed data, a length associated with the uncompressed versions of compressed data, and a continuation instruction.

15. A computer program product for decompressing compressed data comprising:
a computer readable storage medium having computer readable program code embodied therewith, the computer readable program code comprising computer readable program code configured to:
analyze a first decompression dictionary including a plurality of chains each with uncompressed data portions distributed in a non-contiguous manner within the first decompression dictionary based on an addressing scheme, wherein the uncompressed data portions of each chain form a corresponding uncompressed version of compressed data;
generate a second decompression dictionary by combining the uncompressed data portions of each of the chains in the first decompression dictionary to form uncompressed versions of compressed data and inserting instructions within the second decompression dictionary to decompress compressed data; and
decompress compressed data by applying the compressed data to the second decompression dictionary.

16. The computer program product of claim 15, wherein the instructions within the second decompression dictionary include instructions to decompress a single token of the compressed data in a single move.

17. The computer program product of claim 15, wherein the instructions within the second decompression dictionary include instructions to decompress all tokens in the compressed data in a single call.

18. The computer program product of claim 15, wherein the instructions within the second decompression dictionary are independent of computer architecture.

19. The computer program product of claim 15, wherein the instructions and uncompressed versions are together within the second decompression dictionary to exploit cache structures.

20. The computer program product of claim 15, wherein the instructions within the second decompression dictionary include one or more of a move instruction to concatenate the uncompressed versions of compressed data, a length associated with the uncompressed versions of compressed data, and a continuation instruction.

* * * * *